(12) United States Patent
Gleason et al.

(10) Patent No.: US 9,793,479 B2
(45) Date of Patent: Oct. 17, 2017

(54) METHODS FOR FABRICATING DEVICES INCLUDING PHOTOVOLTAIC DEVICES

(71) Applicant: Massachusetts Institute of Technology, Cambridge, MA (US)

(72) Inventors: Karen K. Gleason, Cambridge, MA (US); Vladimir Bulovic, Lexington, MA (US); Miles C. Barr, Cambridge, MA (US); David C. Borrelli, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 778 days.

(21) Appl. No.: 13/714,934

(22) Filed: Dec. 14, 2012

(65) Prior Publication Data
US 2013/0189807 A1  Jul. 25, 2013

Related U.S. Application Data

(60) Provisional application No. 61/576,659, filed on Dec. 16, 2011.

(51) Int. Cl.
*H01L 51/00* (2006.01)
*H01L 51/42* (2006.01)
*H01L 51/56* (2006.01)
*B82Y 10/00* (2011.01)

(52) U.S. Cl.
CPC .......... *H01L 51/0008* (2013.01); *B82Y 10/00* (2013.01); *H01L 51/0036* (2013.01); *H01L 51/42* (2013.01); *H01L 51/56* (2013.01); *H01L 51/0046* (2013.01); *H01L 51/0047* (2013.01); *Y02E 10/549* (2013.01)

(58) Field of Classification Search
CPC .................................................. H01L 51/0096
See application file for complete search history.

(56) References Cited

U.S. PATENT DOCUMENTS

2006/0269664 A1* 11/2006 Gleason et al. ........... 427/248.1
2007/0207571 A1* 9/2007 Morisue et al. ............. 438/107
2010/0089443 A1* 4/2010 Bloomstein et al. ......... 136/255

FOREIGN PATENT DOCUMENTS

WO  WO 2011/163556 A2  12/2011

OTHER PUBLICATIONS

International Search Report and Written Opinion dated Mar. 13, 2013 from International Patent Application No. PCT/US2012/069738.
Admassie et al. "A polymer photodiode using vapour-phase polymerized PEDOT as an anode" *Solar Energy Materials and Solar Cells*, vol. 90 No. 2 pp. 133-141, Jan. 23, 2006.

(Continued)

*Primary Examiner* — Nathan T Leong
(74) *Attorney, Agent, or Firm* — Wolf, Greenfield & Sacks, P.C.

(57) ABSTRACT

Embodiments described herein provide methods for processing various polymer materials for use in devices, such as photovoltaic devices. In some cases, oxidative chemical vapor deposition (oCVD) may be used to process conjugated polymers, including relatively insoluble conjugated polymers. The methods described herein provide processing techniques that may be used to synthesize and/or process polymers, such as unsubstituted thiophene.

41 Claims, 13 Drawing Sheets

(56) References Cited

OTHER PUBLICATIONS

Asatekin et al., "Designing polymer surfaces via vapor deposition" *Materials Today* (2010) vol. 13, No. 5, pp. 26-33, May 1, 2010.
Borrelli et al. "Bilayer heterojunction polymer solar cells using unsubstituted polythiophene via oxidative chemical vapor deposition" *Solar Energy Materials and Solar Cells*, vol. 99, pp. 190-196, Dec. 26, 2011.
Mahriah et al., "Chemical Vapor Deposition of Conformal, Functional, and Responsive Polymer Films" *Advanced Materials* (2010) vol. 22, No. 8, pp. 1993-2027, May 11, 2010.
PCT/US2012/069738, Jun. 26, 2014, International Preliminary Report on Patentability.
International Preliminary Report on Patentability for Application No. PCT/US2012/069738 mailed Jun. 26. 2014.
Bundgaard et al., Low band gap polymers for organic photovoltaics. Solar Energy Materials and Solar Cells. Jul. 6, 2007;91(11):954-85.
Chelawat et al., Conformal, Conducting Poly(3,4-ethylenedioxythiophene) Thin Films Deposited Using Bromine as the Oxidant in a Completely Dry Oxidative Chemical Vapor Deposition Process. Chem Mater. 2010;22(9):2864-8. DOI:10.1021/cm100092c.
Forrest, The limits to organic photovoltaic cell efficiency. MRS Bulletin. Jan. 2005. 30:28-32.
Gevorgyan et al., Bulk Heterojunctions Based on Native Polythiophene. Chem Mater. Jun. 14, 2008;20(13):4386-90.
Howden et al, oCVD poly(3,4-ethylenedioxythiophene) conductivity and lifetime enhancement viaacid rinse dopant exchange. J. Material Chem. A, Materials for energy and sustainabilityA, Dec. 2012. 1(4): 1334-40.
Im et al., Conformal coverage of poly(3,4-ethylenedioxythiophene) films with tunable nanoporosity via oxidative chemical vapor deposition. ACS Nano. Oct. 2008;2(9):1956-67.
Im et al., Systematic Control of the Electrical Conductivity of Poly(3,4-ethylenedioxythiophene) via Oxidative Chemical Vapor Deposition. Macromolecules. 2007;40(18):6552-56.
Jen et al. Facile preparation of electrically conductive poly(isothianaphthene). Synthetic Metals. 1986; 16(3):379-380.

Kaneto et al., Absorption spectra induced by photoexcitation and electrochemical doping in polythiophene. Solid State Communications. Aug. 1984;51(5):267-9.
Kim et al., New Architecture for High-Efficiency Polymer Photovoltaic Cells Using Solution-Based Titanium Oxide as an Optical Spacer. Advanced Materials. Mar. 2006;18(5):572-6. DOI: 10.1002/adma 200501825.
Kobayashi et al., The electronic and electrochemical properties of poly(isothianaphthene). J. Chem. Phys. Jun. 15, 1985. 82(12): 5717-23.
Lock et al., Electrochemical investigation of PEDOT films deposited via CVD for electrochromic applications. Synthetic Metals. Nov. 2007;157(22-23):894-8.
Lock et al., Oxidative Chemical Vapor Deposition of Electrically Conducting Poly(3,4-ethylenedioxythiophene) Films. Macromolecules. 2006; 39(16):5326-5329.
Peumans et al., Small molecular weight organic thin-film photodetectors and solar cells. J Applied Physics. Apr. 1, 2003. 93(7): 3693-723.
Roncali, Molecular engineering of the band gap of π-conjugated systems: Facing technological applications. Macromolecular Rapid Communications. 2007;28:1761-75. DOI: 10.1002/marc. 200700345.
Tromholt et al., Thermocleavable materials for polymer solar cells with high open circuit voltage-a comparative study. ACS Appl Mater Interfaces. Dec. 2009 DEC;1(12):2768-77.
Valaski et al., Organic photovoltaic devices based on polythiophene films electrodeposited on FTO substrates, Sol. Energy Mater. Sol. Cells. Jan. 25, 2007. 91: 684-8.
Xue et al., Asymmetric tandem organic photovoltaic cells with hybrid planar-mixed molecular heterojunctions. Appl Phys Lett. Dec. 6, 2004;85(23):5757-9.
Yu et al., A two-step method combining electrodepositing and spin-coating for solar cell processing, J. Solid State Electrochem., 14 (2010) 1051-1056. DOI 10.1007/s10008-009-0919-x.
Nejati et al., Chemical vapor deposition synthesis of tunable unsubstituted polythiophene. Langmuir. Dec. 20, 2011;27(24):15223-9. doi: 10.1021/1a203318f. Epub Nov. 18, 2011.

* cited by examiner

| Polymer | Band gap (eV) | Structure | Generalized Structure |
|---|---|---|---|
| Polythiophene (PT) | 2.0 |  |  |
| Polyisothianaphthene (PITN) | 1.1 |  |  |
| Polythieno[3,4-b]pyrazine | ~0.7 |  |  |
| Polythieno-[3,4-b]thiophene | 0.85 |  |  |
| Poly(thieno-[3,4-c]thiophene) | 1.6 |  |  |
| Polyselenophene | 1.9 |  |  |
|  |  |  |  |

| Polymer | Band gap (eV) | Structure | Generalized Structure |
|---|---|---|---|
| (1) | 1.0 | | |
| (2) | 1.7 | | |
| (3) | 1.1 | | |

METHODS FOR FABRICATING DEVICES INCLUDING PHOTOVOLTAIC DEVICES

RELATED APPLICATIONS

This application claims priority under 35 U.S.C. §119(e) to U.S. Provisional Application Ser. No. 61/576,659, filed Dec. 16, 2011, the contents of which are incorporated herein by reference in its entirety for all purposes.

FIELD OF THE INVENTION

The present invention relates to methods for fabricating devices, including photovoltaic devices which include electron-donating and/or semiconducting materials.

BACKGROUND OF THE INVENTION

Semiconducting polymers and low molecular weight organic molecules have received significant attention for their application as active layers in organic solar cells, due to their potential low cost, high mechanical flexibility, wide array of functionalities, and well-understood structure-composition-property relationships. In fact, both solution-printed polymer solar cells and vacuum-deposited small molecule organic solar cells have independently reached record certified efficiencies of around 10%, through careful materials selection and device architecture engineering.

Vapor-deposited polymer solar cells would enhance the ability to integrate attractive materials into organic solar cells. For example, unsubstituted polymers, which are reported to be more stable because their highly compact structures prevent oxygen permeation into the polymer bulk, are also insoluble and infusible because of their compact structures. Furthermore, the vacuum fabrication of multilayered devices is not constrained by the requirement of finding solvents that will not dissolve the underlying layers to prevent mixing between layers during deposition. However, the high temperatures necessary to physically deposit polymers by vacuum thermal evaporation leads to polymer degradation, limiting materials to low-molecular-weight organics. The few reports of the use of a vapor deposition technique (such as physical deposition, plasma polymerization, and thermal chemical vapor deposition) to deposit a polymer photoactive layer resulted in low corresponding device efficiencies (<0.3%). Thus a soluble derivative (e.g. poly(3-hexylthiophene)) or an oligomeric version are typically used to facilitate processing by standard solution printing or vacuum thermal evaporation.

SUMMARY OF THE INVENTION

The present invention provides methods for forming a semiconducting polymer on a surface. The method may comprising reacting a vapor-phase monomer species and a vapor-phase oxidizing agent to produce a vapor comprising a semiconducting polymer precursor; contacting the vapor with a surface to form the semiconducting polymer precursor on the surface; and treating the semiconducting polymer precursor on the surface with a reducing agent to produce the semiconducting polymer.

The present invention also provides methods for fabricating a photovoltaic device. The method may comprising reacting a vapor-phase monomer species and a vapor-phase oxidizing agent to produce a vapor comprising an electron-donating polymer or electron-donating polymer precursor; contacting the vapor with a surface to form the electron-donating polymer or electron-donating polymer precursor on the surface; optionally, treating the electron-donating polymer precursor on the surface with a reducing agent to produce the electron-donating polymer; and providing an electron-accepting material in contact with the electron-donating polymer.

Figure 1:
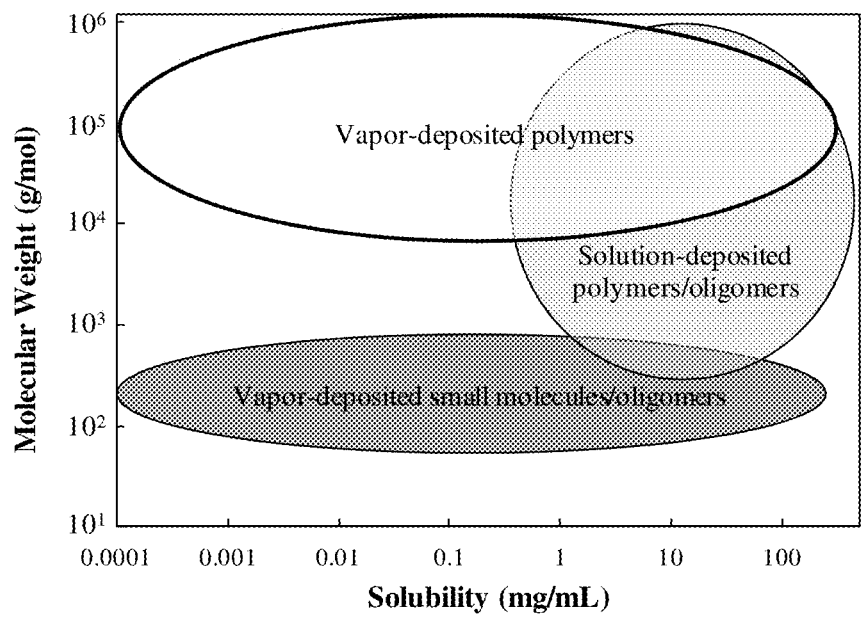
FIG. 1 illustrates a graph of various properties of materials deposited by various techniques for use in organic solar cells. Traditionally, the use of polymer is limited to those that can be dissolved so that it can be deposited by some solution-based technique. Vapor deposition is usually limited to molecules with low enough molecular weight to be thermally evaporated. This leaves a region of vapor-deposited polymers that is difficult to access by traditional methods.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Embodiments described herein provide methods for processing various polymer materials for use in devices, such as photovoltaic devices. In some cases, the method may involve formation of a polymer species and deposition of the polymer species onto the surface of a substrate. For example, oxidative chemical vapor deposition (oCVD) may be used to process conjugated polymers, including relatively insoluble conjugated polymers. The methods described herein provide simplified processing techniques that may be used to synthesize and/or process polymers, including semiconducting polymers.

An advantageous feature of methods described herein is that the polymer materials may be processed under relatively mild conditions, allowing for the use of a wide range of substrates, including flexible substrates such as paper. In some cases, the method may be conducted at ambient or relatively low temperatures. In some cases, the method may involve the use of solvent-free techniques (e.g., vapor-phase techniques). Using such methods, multi-layer devices may be readily fabricated with reduced risk of damage to and/or dissolution of underlying layers. Another advantageous feature provided by methods described herein is the ability to produce uniform coatings, including conformal coatings, over large surface areas. In some embodiments, the method may involve oxidative chemical vapor deposition (oCVD). In oCVD, polymers (e.g., conjugated polymers) may be simultaneously synthesized from vapor phase precursors (e.g., monomer species and oxidizing agents) and deposited on a substrate at relatively low temperatures (25-100° C.) and under moderate vacuum (~0.1 Torr). The use of oCVD may provide processing benefits of vacuum processing, including parallel and sequential deposition, well-defined thickness control and uniformity, and inline integration with other standard vacuum processes (e.g. vacuum thermal evaporation). Moreover, oCVD is conformal over nonplanar substrates, enabling compatibility with substrates such as paper and textiles. In contrast, vacuum thermal evaporation is generally subject to line-of-sight deposition, while conformal deposition of liquid-phase systems is complicated by surface tension effects around micro- and nano-scale features.

In some embodiments, oCVD may be used to deposit semiconducting polymers for use as donor materials in, for example, organic photovoltaic devices.

Figure 11A:
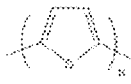
FIG. 11 shows example of (a) homopolymers and (b) copolymers formed using oCVD.
Figure 11A:
Figure 11A:
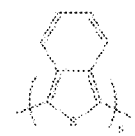
Figure 11A:
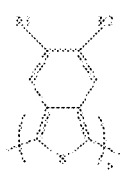
Figure 11A:
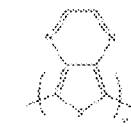
Figure 11A:
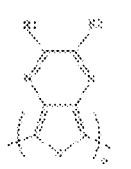
Figure 11A:
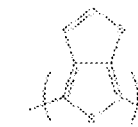
Figure 11A:
Figure 11A:
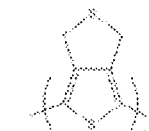
Figure 11A:
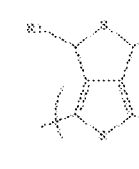
Figure 11A:
Figure 11A:
Figure 11A:
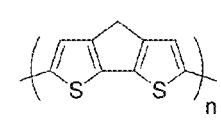
Figure 11A:
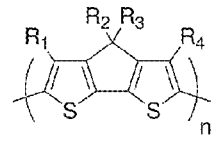

The method may involve reacting a vapor-phase monomer species and a vapor-phase oxidizing agent to produce a vapor comprising a polymer species. The vapor may then be contacted with a surface to form a coating, layer, or film of the polymer species on the surface. In some cases, the polymer species is a semiconducting polymer, such as a conjugated polymer. The conjugated polymer may be polyacetylene, polyarylene, polyarylene vinylene, or polyarylene ethynylene, any of which are optionally substituted. In some cases, the conjugated polymer is polyphenylene, polythiophene, polyisothianapththene (PITN), polythieno[3,4-b]pyrazine, polythieno[3,4-b]thiophene, polythieno[3,4-c]thiophene, polypyrrole, polyaniline, polyselenophene, or polyacetylene, any of which are optionally substituted. Other examples of conjugated polymers are shown in FIGS. 11A-B, where $R^{1-6}$ can be hydrogen, halo (e.g., bromo, chloro, fluoro, iodo) hydroxyl, cyano, nitro, amino, carbonyl group, alkyl, heteroalkyl, substituted derviatives thereof, or the like.

In one set of embodiments, the polymer is an optionally substituted polythiophene. Examples include poly(3,4-ethylenedioxythiophene) (PEDOT), poly(3-hexylthiophene) (P3HT), poly(3-bromo 4-methyl thiophene), poly(3-butylthiophene) and poly(2-(3-thienyl)ethanol). In a particular embodiment, the conjugated polymer is an unsubstituted polythiophene.

In some cases, the method may involve reacting a vapor-phase monomer species and a vapor-phase oxidizing agent to produce a vapor comprising a semiconducting polymer precursor. The vapor may be contacted with a surface to form the semiconducting polymer precursor on the surface, which may then be further treated to produce the semiconducting polymer. For example, due to presence of excess oxidizing agent, a doped or oxidized polymer species may be generated in vapor phase, which may be treated with a reducing agent post-deposition to produce the final, undoped or reduced polymer species. In an illustrative embodiment, the method may involve oxidative polymerization of thiophene to a doped form of polythiophene, wherein the polythiophene is in oxidized form and contains polarons and bipolarons. Post-deposition treatment with a reducing agent such as methanol may produce the semiconducting form of thiophene.

Those of ordinary skill in the art would be able to select the appropriate monomer species for use in a particular application. In some embodiments, the monomer may be substantially solid at room temperature. In some embodiments, the monomer may be substantially liquid at room temperature. In some cases, the monomer species is a compound comprising an aryl or heteroaryl group, any of which is optionally substituted. The monomer species may be, for example, an optionally substituted heteroaryl group such as an optionally substituted thiophene. Examples of aryl or heteroaryl groups include, but are not limited to phenyl, naphthyl, tetrahydronaphthyl, indanyl, indenyl, fluorenyl, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like, any of which is optionally substituted. In some embodiments, the monomer is a substituted thiophene. Some examples of monomer species include thiophene, 3-butylthiophene, 3-hexylthiophene, 3-bromo-4-methylthiophene, 3,4-ethylenedioxythiophene, isothianaphthene, 2,1,3-benzothiadiazole, selenophene, 2-(3-thienyl)ethanol, 4H-cyclopenta[2,1-b;3,4-b']dithiophene, 2,2'-bithiophene, and 2,2';5',2-terthiophene.

Figure 10:
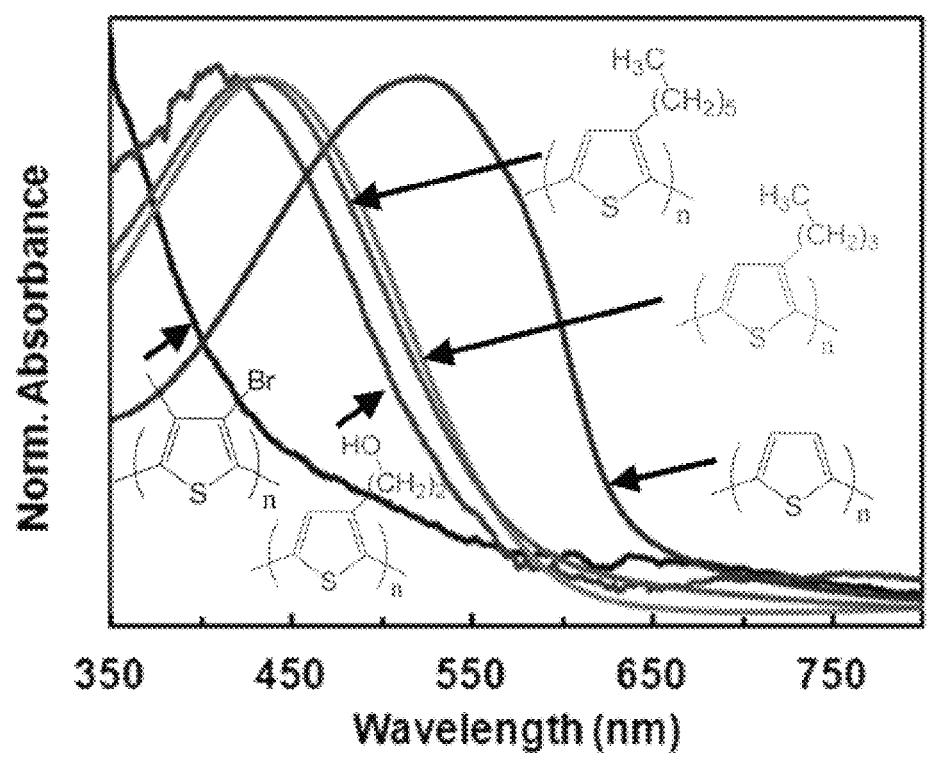
FIG. 10 shows the absorption spectra for semiconducting polymers formed using oCVD, post-rinsing.

In some cases, the optical band gap of the polymer may be tuned by selecting and combining monomers having different substituents. For example, FIG. 10 shows the absorption spectra for semiconducting polymers formed using oCVD, post-rinsing.

The oxidizing agent may be any species capable of oxidizing, i.e., removing electrons from, another reactant in a redox chemical reaction. The oxidizing agent may include one or more metal atoms. In some cases, the oxidizing agent comprises a heteroatom. In some cases, the oxidizing agent comprises a halogen. Examples of oxidizing agents include, but are not limited to, oxygen, ozone, hydrogen peroxide, hydrogen chloride, $CuCl_2$, $FeCl_3$, $FeBr_3$, $I_2$, $POBr_3$, $GeCl_4$, $SbI_3$, $Br_2$, $SbF_5$, $SbCl_5$, $TiCl_4$, $GeCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $[CH_3(CH_2)_3]_2O.BF_3$, $(C_2H_5)_3O(BF_4)$, or $BF_3.O(C_2H_5)_2$. In one embodiment, the oxidizing agent is $FeCl_3$.

Those of ordinary skill in the art would be capable of selecting suitable monomers and oxidizing agents to produce a particular desired polymer. In some cases, the ionization potential of the monomers may provide information as to how readily a monomer would undergo a polymerization reaction. In other cases, various screening tests may be conducted to select the appropriate combination of monomers and oxidizing agents. For example, a small amount of monomer (e.g., liquid or vapor-phase monomer) may be combined in a vial or flask with a small amount of oxidizing agent (e.g., liquid or vapor-phase oxidizing agent), and the resulting product may be studied to determine if polymerization successfully occurred. In some cases, it may be possible to visually determine whether or not the combination of monomer and oxidizing agent resulted in polymerization.

The reducing agent may be any species capable of reducing, i.e., donating electrons to, another reactant in a redox chemical reaction. The reducing agent may include one or more metal atoms. In some cases, the reducing agent comprises a heteroatom. In some cases, the reducing agent comprises a halogen. Examples of reducing agents include, but are not limited to, alcohols, bases, acids, or water. In some embodiments, the reducing agent is ammonia, tetrakis(dimethylamino)ethylene (TDAE), methanol, ethanol, ammonia, lithium aluminum hydride, sodium borohydride, hydrazine, diisobutylaluminum hydride, or water. Those of ordinary skill in the art would be capable of selecting suitable reducing agents to produce a particular desired polymer. In some cases, various screening tests may be conducted to select the appropriate reducing agent. For example, a polymerized material may be contacted (e.g., rinsed) with a small amount of reducing agent and the resulting product may be studied to determine if the desired product was successfully obtained.

Methods described herein may be useful in the fabrication of devices, including photovoltaic devices (e.g. solar, cells), light-emitting diodes, electrochromic devices, or any device including a photoactive layer. In some cases, the method involves reacting a vapor-phase monomer species and a vapor-phase oxidizing agent to produce a vapor comprising an electron-donating polymer or electron-donating polymer precursor (e.g., a doped polymer). The vapor may be contacted with a surface as described herein. If needed, the electron-donating polymer may be treated with a reducing agent to produce the electron-donating polymer (e.g., an undoped polymer). The method may also involve providing an electron-accepting material in contact with the electron-donating polymer. In some cases, it may be advantageous to evaporate and/or deposit additional components of a device. For example, in the case of a solar cell, an acceptor material (e.g., $C_{60}$) may be evaporated and/or deposited to form a bulk heterojunction solar cell with the polymer. In some cases, the additional component may be evaporated and/or deposited at the same time as oCVD of the polymer.

Those of ordinary skill in the art will be able to select suitable electron-donating and electron-accepting materials for use in methods described herein. In some embodiments, the electron-donating polymer may be a conducting polymer or conjugated polymer. The polymer may be a homopolymer, a copolymer including random copolymers and block copolymers, and the like.

In some cases, the electron-donating polymer is a polythiophene. Poly(thiophenes) will be known to those of ordinary skill in the art and generally contain the repeating unit:

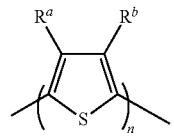

wherein $R^a$ and $R^b$ can be the same or different and each can independently be hydrogen, alkyl, heteroalkyl aryl, heteroaryl, arylalkyl, arylheteroalkyl, heteroarylalkyl, each optionally substituted, or $R^a$ and $R^b$ can be joined to form an optionally substituted ring (e.g., a saturated or unsaturated ring); and n can be any integer between 2 and 100,000,000. In some embodiments, $R^a$ and $R^b$ are hydrogen. Poly(thiophenes) can be used in connection with electron-accepting materials (e.g., n-type materials) to form bulk heterojunctions, the resulting compositions finding use in a variety of applications including photovoltaic cells (e.g., solar cells).

Those of ordinary skill in the art will be able to select suitable electron acceptor materials (e.g., n-type materials) for use in the embodiments described herein. The term "n-type material" is given its ordinary meaning in the art and refers to a material that has more negative carriers (electrons) than positive carriers (holes). Non-limiting examples of n-type materials include aromatic hydrocarbons including fullerenes, inorganic nanoparticles, carbon nanorods, inorganic nanorods, polymers containing moieties capable of accepting electrons or forming stable anions, or combinations thereof. In some embodiments, the n-type material is a fullerene, optionally substituted. As used herein, the term "fullerene" is given its ordinary meaning in the art and refers to a substantially spherical molecule generally comprising a fused network of five-membered and/or six-membered aromatic rings. For example, $C_{60}$ is a fullerene which mimics the shape of a soccer ball. The term fullerene may also include molecules having a shape that is related to a spherical shape, such as an ellipsoid. It should be understood that the fullerene may comprise rings other than six-membered rings. In some embodiments, the fullerene may comprise seven-membered rings, or larger. Fullerenes may include $C_{36}$, $C_{50}$, $C_{60}$, $C_{61}$, $C_{70}$, $C_{76}$, $C_{84}$, and the like. Fullerenes may also comprise individual atoms, ions, and/or nanoparticles in the inner cavity of the fullerene. A non-limiting example of a substituted fullerene which may be used as the n-type material is phenyl-$C^{61}$-butyric acid methyl ester.

In one set of embodiments, the electron-donating material is a polythiophene and the electron-accepting material is a fullerene.

The substrate can be any material capable of supporting the device components described herein. That is, the substrate may be any material to which the electron-donating polymer, semiconducting polymer, or other materials described herein, may adhere. The substrate may be selected to have a thermal coefficient of expansion similar to those of the other components of the device to promote adhesion and prevent separation of the device components at various temperatures.

The surface may be any surface of any substrate, including glass, plastics, metals, polymers, paper, fabric and the like. The surface may include those constructed out of more than one material, including coated surfaces (e.g., indium tin oxide-coated glass). Non-limiting examples of surfaces include paper, ceramics, carbon, fabric, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-Tex™, Marlex™, expanded polytetrafluoroethylene (e-polythiopheneFE), low density polyethylene (LDPE), high density polyethylene (HDPE), polypropylene (PP), and poly(ethylene terephthalate) (PET).

Devices described herein may be fabricated to include one or more semiconducting, electron-donating, and/or electron-accepting materials. For example, the device may be an organic photovoltaic (OPV) device. In some cases, the device may be an electrochromic device. In some cases, the device may include tandem cells. In some embodiments, the device comprises two semiconducting materials, where the two materials are different.

Various components of a device, such as the electrodes, power source, electrolyte, separator, blocker, container, circuitry, insulating material, gate electrode, etc. can be fabricated and/or selected by those of ordinary skill in the art from any of a variety of components. Components may be molded, machined, extruded, pressed, isopressed, infiltrated, coated, in green or fired states, or formed by any other suitable technique. Those of ordinary skill in the art are readily aware of techniques for forming components of devices herein. Electromagnetic radiation may be provided to the systems, devices, electrodes, and/or for the methods described herein using any suitable source.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

EXAMPLES

Example 1

Figure 12:
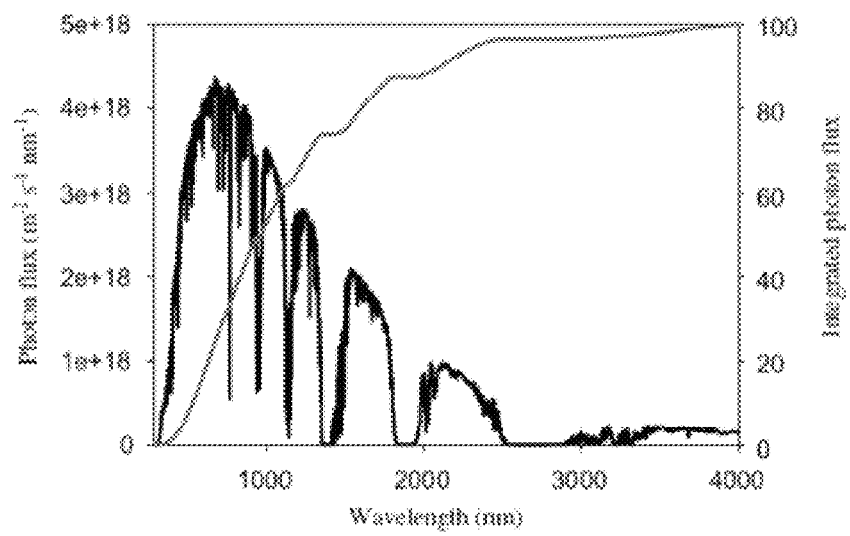
FIG. 12 shows the spectrum of photon flux in the solar spectrum and the integrated flux as a function of wavelength.

The following example describes some factors that can contribute to the energy level engineering of semiconducting polymers, according to some embodiments. The band gap of a material is the difference between the highest occupied molecular orbital (HOMO) and the lowest unoccupied molecular orbital (LUMO). This energy difference, $E_g$, can determine what wavelengths of light a material will absorb. Because of the large band gap in most organic materials, only a small portion of the incident solar light is typically absorbed. FIG. 12 shows the spectrum of photon flux in the solar spectrum and the integrated flux as a function of wavelength. The maximum photon flux in the solar spectrum is around 1.77 eV (700 nm). Without wishing to be bound by theory, by lowering $E_g$ of a material from 2 eV (620 nm) to 1.1 eV (1130 nm), the percentage of solar irradiation that can be harvested can be increased from 30% to 77% 23. This can result in a significant increase in the current density of an OPV. Thus, low band gap polymers may be useful for use in OPVs.

Many different factors contribute to the value of $E_g$ for a material. For example, some conjugated systems may exhibit a band gap due to the hindrance of delocalization of the electrons through the entire chain. The band gap can be expressed as the sum of five energy contributions, $$E_g = E_{BLA} + E_{Res} + E_\theta + E_{Sub} + E_{Int}.$$

Figure 13:
FIG. 13 shows alternation of C—C bonds between single and double bonds from aromatic (left) to quinoid (right) forms of a polythiophene.

The bond length alternation (BLA) energy, $E_{BLA}$, is typically the largest contribution to the energy gap. It is related to the difference in the bond lengths of single and double bonds. In the hypothetical case of complete delocalization, all the C—C bonds would be of equal length. However, localization of the pi electrons is generally more stable for the conjugated system because of electron-phonon coupling and electron-electron correlation. Thus, the BLA can significantly add to the energy gap. For some conjugated systems, such as polythiophene, the aromatic and quinoid form have non-degenerate energy levels. (FIG. 13) The energy required to switch between these two forms depends in part on the stabilizing resonance energy of the aromatic unit. Electronic resonance often prevents the delocalization of pi electrons along the entire conjugated chain by confining them within the aromatic ring. Thus, energy from resonance effects, $E_{res}$, can make a contribution to $E_g$. Additionally, a dihedral angle $\theta$ between consecutive units can also limit the delocalization of pi electrons along the conjugated backbone. This increases $E_g$ by $E_\theta$. In some cases, the introduction of electron-withdrawing or electron-releasing substituents affects the HOMO and LUMO levels and in turn, $E_g$. Thus, substituents on the polymer can contribute the term $E_{Sub}$ to $E_g$. Lastly, there are intermolecular interactions between chains that further contribute to the energy gap by $E_{int}$.

Figure 14:
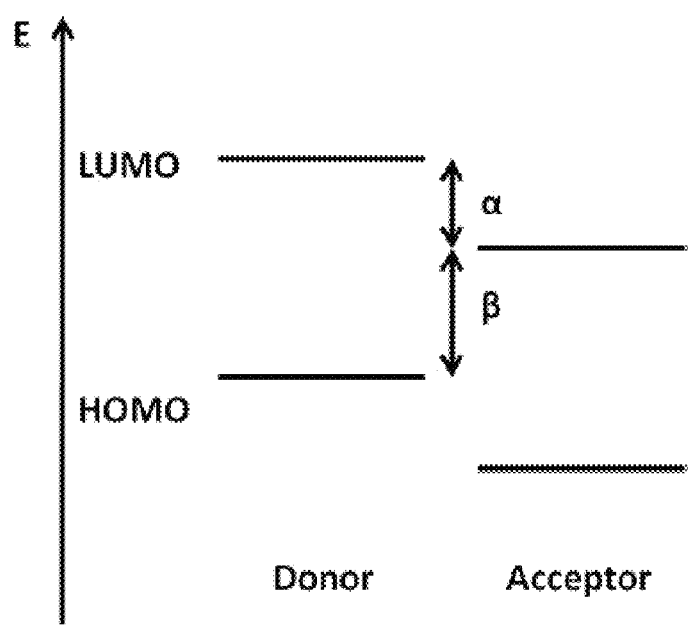
FIG. 14 shows the energy levels of photoactive materials.

A lower band gap in the donor material does not alone ensure improved performance in OPVs like solar cells. The performance of the OPV also depends on the relative positions of the HOMO and LUMO levels of the donor and acceptor materials. The maximum open circuit voltage ($V_{oc}$) is a function of the difference between the HOMO of the donor and LUMO of the acceptor, given by β in FIG. 14, minus the binding energy of the dissociated electron-hole pair. Experimentally, $V_{oc}$ values are typically given by $V_{oc} \approx (1/e)\beta - 0.3$ V.

The $V_{oc}$ has been found to be only slightly dependent on the electrode work functions and more dependent on changes in the HOMO of the donor and LUMO of the acceptor materials. The band gap of the donor material is given by α+β. (FIG. 14) It is also important to note that the difference in the LUMO levels of the donor and acceptor, α, generally has a minimum value for efficient charge separation of the exciton. Values of α≈0.3–0.5 eV can be sufficient, but larger values can result in greater efficiency. Thus, in lowering the band gap of the donor, it can be helpful in some cases to maintain a sufficiently high value for the LUMO level. Because of this tradeoff between $I_{SC}$ and $V_{oc}$ in changing the band gap, an optimal band gap for single heterojunction devices in some embodiments can be between about 1.3 eV and about 1.8 eV, depending on the assumptions used.

Example 2

The following examples describe the preparation, characterization, and application of unsubstituted polythiophene by oCVD for use as a photoactive semiconductor in organic solar cells. As-deposited and methanol-rinsed oCVD polythiophene films were characterized to confirm polymer dedoping upon post-processing with methanol. The resulting semiconducting polythiophene was then applied as an electron donor in bilayer heterojunction solar cells with a thermally evaporated $C_{60}$ electron acceptor layer, resulting in power conversion efficiencies up to 0.8%. This demonstrates that the oCVD technique can be used in the processing and design of polymer active layers for polymer solar cells and hybrid small molecule organic solar cells without solubility, temperature, or substrate considerations.

Polythiophene Depositions

The polymer deposition procedure using the oCVD process and the custom-built reactor configuration are described in detail, for example, in J. P. Lock, S. G. Im, K. K. Gleason, Macromolecules, 39 (2006) 5326-5329, and S. G. Im, K. K. Gleason, Macromolecules, 40 (2007) 6552-6556, both of which are incorporated herein by reference in their entireties for all purposes. Briefly, the oCVD reactor consisted of a vacuum chamber with monomer inlet ports and an exhaust to a pump. A heated crucible holding the oxidizing agent was arranged in the bottom of the chamber, and directly above it was an inverted stage for the substrate. The stage and reactor body were maintained at 30° C. and 45° C., respectively. The chamber pressure was held constant at 150 mTorr using a butterfly valve. Iron(III) chloride ($FeCl_3$, 97%, Sigma-Aldrich) and thiophene (≥99%, Sigma-Aldrich) were used as purchased. Quartz slides, silicon wafers, and ITO-coated glass were used as substrates. $FeCl_3$ was used at the oxidizing agent and it was sublimed at 340° C. Polymer film thickness was controlled by varying the amount of $FeCl_3$ loaded in the crucible. Vapor phase thiophene monomer was introduced into the reactor from a side port on the reactor. The thiophene monomer jar was maintained at a temperature of 25° C. and a needle valve was used to limit the flow rate to about 1 sccm. A deposition time of 20 minutes was used for all films. After deposition, the films were rinsed in methanol (≥99.9%, Sigma-Aldrich) for 2 minutes to remove reacted oxidant.

Polymer Characterization

UV-vis spectra of the studied films on quartz substrates were measured with a Varian Cary 5000 UV-vis spectrophotometer. Transmission and reflection spectra were measured. The reflection spectra were obtained using a specular reflectance accessory and an Al standard reference mirror (ThorLabs). Fourier transform infrared (FTIR) measurements of polythiophene films on silicon wafers were performed on a Nexus 870, Thermo Electron Corp. spectrometer. Film compositions were estimated by XPS using a Surface Science Instruments (SSI) model SSX-100 with operating pressure $<2\times10^{-9}$ Torr utilizing monochromatic AlKα X-rays at 1486.6 eV. Photoelectrons were collected at an angle of 55-degrees from the surface normal. Film thicknesses were measured using a Veeco Dektak 150 surface profilometer. polythiophene film thicknesses used for devices were approximated by measuring the thickness of polythiophene on glass slides placed close to the ITO substrates from the same deposition. The sheet resistance of the as-deposited polythiophene films were measured with a Jandel four-point probe in air. Conductivity values were calculated using the measured sheet resistivity and thickness measured with the profilometer. Cyclic voltammetry measurements were conducted using a 660D potentiostat (CH Instruments) with a standard three-electrode configuration under a nitrogen atmosphere. The oCVD polythiophene film on ITO/glass was the working electrode, $Ag/AgNO_3$ (0.01 M in acetonitrile) was the reference electrode, and a platinum mesh attached to a platinum wire was used as the counter electrode. The measurements were performed in acetonitrile with tetrabutylammonium hexafluorophosphate (0.1 M) as the supporting electrolyte at a scan rate of 100 mV $s^{-1}$. The Fc/Fc+ redox couple was used to calibrate the Ag/Ag+ reference electrode.

Device Fabrication and Characterization

The OPVs were fabricated on glass substrates that were precoated with a 150 nm thick, patterned indium-tin oxide (ITO) transparent anode with 15 n/sq sheet resistance (Kintec Co.). Prior to use, the substrates were successively cleaned by ultrasonic treatment in detergent solution (Micro 90), 2× de-ionized water, 2× acetone and 2× isopropanol for 5 minutes each. The substrates were then treated with $O_2$ plasma for 30 seconds. A polythiophene film of varying thickness was deposited onto the cleaned ITO via oCVD as described above. Samples were exposed to air for approximately 10 minutes in transferring them to a glovebox. $C_{60}$ (99.9%, sublimed, Sigma-Aldrich) was purified once by vacuum train sublimation prior to loading, while bathocuproine (BCP, from Luminescence Technology Corp.) and Ag (Alfa Aesar, 1-3 mm shot, 99.9999%) were used as purchased. $C_{60}$, BCP (8 nm), and a 100 nm thick Ag cathode were sequentially deposited via thermal evaporation at a rate of 0.1 nm/s. The cathode films were deposited through a shadow mask for single devices, defining a 1 mm×1.2 mm active device area, and there were 10 devices per substrate. The current-density-voltage (J-V) measurements were recorded by a Keithley 6487 picoammeter and 100±10 mW $cm^{-2}$ illumination was provided by a nitrogen-glovebox-integrated 1 kW xenon arc-lamp (Newport 91191) equipped with an AM1.5G filter. The solar simulator intensity was measured with a calibrated silicon photodiode. The external quantum efficiency (EQE) spectra were measured with a Stanford Research Systems SR830 lock-in amplifier, under a focused monochromatic beam of variable wavelength light generated by an Oriel 1 kW xenon arc lamp coupled to an Acton 300i monochromator and chopped at 43 Hz. A Newport 818-UV calibrated silicon photodiode was used to measure the incident monochromatic light intensity.

Polythiophene Synthesis

Figure 2:
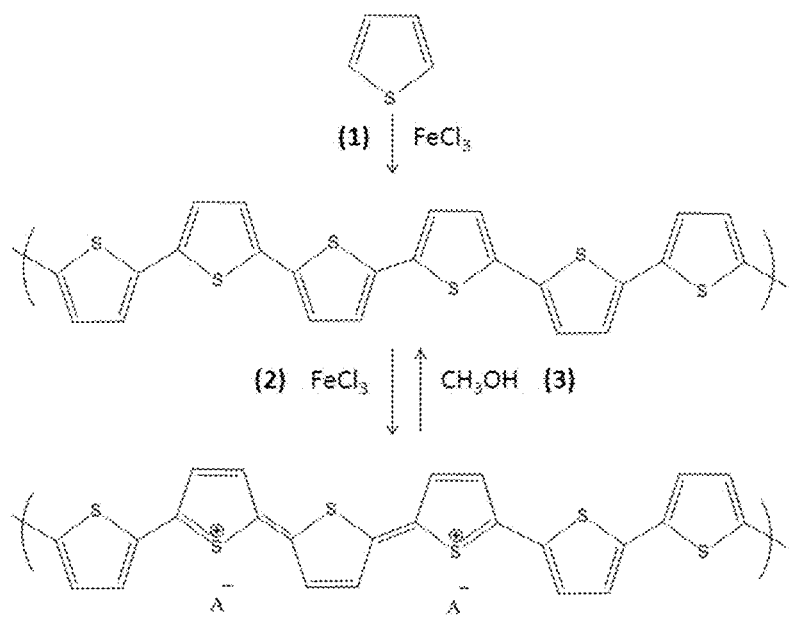
FIG. 2 shows processes which can occur during and after an oxidative chemical vapor deposition (oCVD) process, including the following: (1) oxidative polymerization of thiophene to polythiophene; (2) oxidation of the polymer chain leads to the formation of polarons and bipolarons, which are charge balanced by counteranion dopants; and (3) post-deposition rinsing the deposited film with methanol reduces it back to neutral polythiophene.
Figure 3:
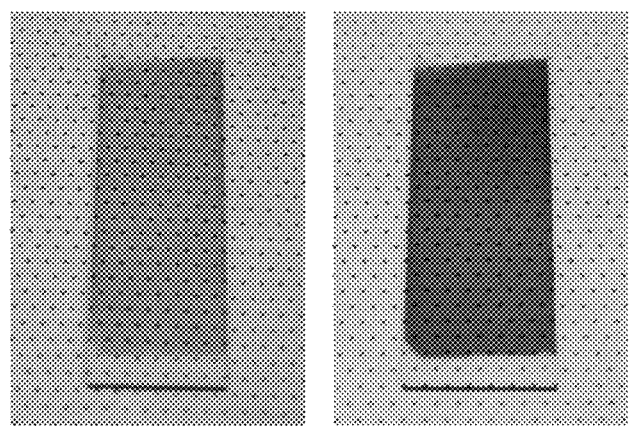
FIG. 3 shows photographs of as-deposited oCVD polythiophene film (left) and methanol-rinsed film (right) uniformly deposited on 25×75 mm glass slides. The blue (left) polythiophene film is doped with $FeCl_3$ and has a conductivity between 10 and 20 S cm-1, whereas the red (right) film is neutral polythiophene and nonconductive.

Following a procedure similar to that described in J. P. Lock, S. G. Im, K. K. Gleason, Macromolecules, 39 (2006) 5326-5329, for the deposition of poly(3,4-ethylenedioxythiophene) (PEDOT) by oCVD, thiophene monomer vapor was fed into a reaction chamber. Thiophene reacted via oxidative polymerization with sublimated iron(III) chloride on a substrate to result in the deposition of a solid, polymer film, as shown in FIG. 2(1). Without wishing to be bound by any theory, a possible mechanism for the oxidative polymerization of thiophene involves the formation of radical cations. Further oxidation results in the formation of polarons and bipolarons, making the polymer conductive. The cations are charge balanced by counter anions. (FIG. 2(2)) The resulting polymer film from the oCVD process is a conductive, blue film (FIG. 3), suggesting that $FeCl_3$ is present in large enough concentrations during the oCVD process to over-oxidize the polythiophene, as has been seen during chemical polymerization in solution. Based on conductivity measurements in air, the doped polythiophene film conductivities ranged from 10 to 20 S $cm^{-1}$.

A post-deposition rinse treatment of the films with methanol caused them to become nonconductive and undergo an abrupt color change to red. (FIG. 3) The conductivities of the methanol-rinsed films were below the detection limit of the equipment used ($<10^{-4}$ S $cm^{-1}$). The observed changes in conductivity and color of the films suggest that the methanol rinse dedoped the polythiophene. (FIG. 2(3)) Composition measurements from X-ray photoelectron spectroscopy (XPS) survey scans showed that the methanol rinse significantly reduced the amount of iron and chlorine in the polythiophene film (Table 1). It is possible that the dedoping mechanism follows a similar mechanism as that for other reactions involving the oxidation of primary alcohols with strong electrophiles, as described in J. G. Smith, Organic Chemistry 2ed., McGraw Hill, Boston, 2007. Additionally, the high solubility of iron in methanol resulted in rapid removal of most of the reacted oxidant.

TABLE 1

Atomic ratios in PT films from XPS survey scans after various methanol rinsing times.

| Rinsing time (min) | C:S | Fe:S | Cl:S |
|---|---|---|---|
| 0 | 16 | 1.6 | 2.8 |
| 2 | 6.1 | 0.05 | 0.07 |
| 60 | 5.8 | 0.05 | 0.07 |
| 240 | 5.7 | 0.05 | 0.07 |

UV-Vis and Fourier Transform Infrared (FTIR) Spectroscopy

Figure 4:
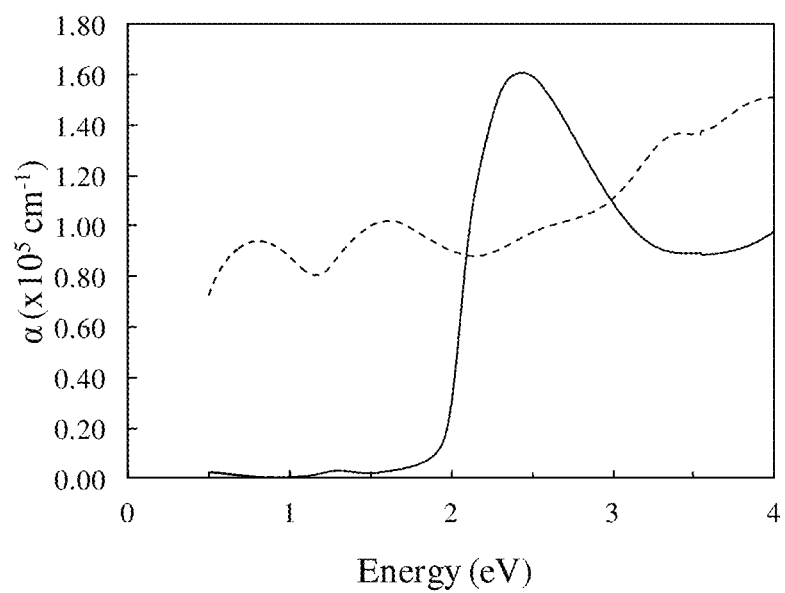
FIG. 4 shows a graph of the absorption coefficient of doped (- -) and dedoped (-) oCVD polythiophene films on quartz. The energy levels of midgap peaks in the doped film suggest that it is heavily doped, resulting in bipolarons in the film.

The UV-vis absorption spectra of the as-deposited and methanol-rinsed polythiophene films are shown in FIG. 4. The presence of midgap energy states in the as-deposited polythiophene film was indicative of the presence of polarons or bipolarons. The energy levels of the peaks (0.8 and 1.6 eV) suggested that the conductive polythiophene film was heavily doped and contained bipolarons. The maximum of the absorption coefficient of the methanol-rinsed polythiophene occurred at 495 nm (~2.5 eV). The optical band gap, taken as the intersection of the line tangent to the band edge with the x-axis, was 1.96 eV. These values match those of electrochemically and chemically polymerized neutral polythiophene. This further supports the hypothesis that the methanol rinse reduces the polythiophene film.

Figure 5:
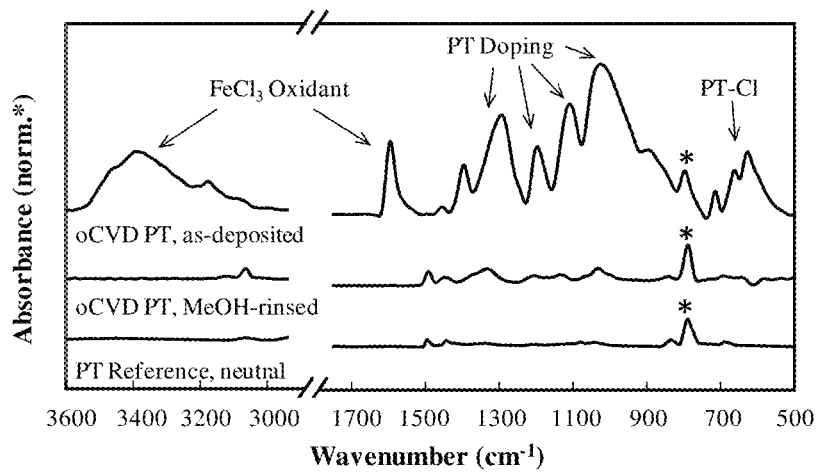
FIG. 5 shows FTIR spectra of oCVD PT film before and after MeOH rinse. The bottom spectrum is a reference spectrum for neutral PT. All spectra are normalized by the C—H vibrational peak at 790 cm-1, as indicated by the asterisk.

The FTIR spectra of the as-deposited and methanol-rinsed films are shown in FIG. 5, along with a reference spectra for neutral polythiophene. The MeOH-rinsed spectrum matched the neutral reference spectrum closely, suggesting that neutral (dedoped) polythiophene was indeed formed. All spectra show peaks at around 790 cm$^{-1}$, attributed to C—H out-of-plane vibration for 2,5-substituted thiophene, along with peaks at 1450 and 1490 cm$^{-1}$ due to 2,5-substituted thiophene ring stretching, and a C—H stretching peak at 3060 cm$^{-1}$. To elucidate the relative strength of doping-induced absorption peaks in the as-deposited polythiophene sample, all spectra were normalized by the C—H vibrational peak at 790 cm$^{-1}$, as its intensity has previously been reported to be independent of doping effects. The as-deposited polythiophene film showed strong peaks throughout the spectral range that were not present in the spectra for the neutral reference or MeOH-treated oCVD polythiophene film. It has previously been reported for oCVD PEDOT films that the presence of broad and strong absorption peaks in the 1400-700 cm$^{-1}$ range films are indicative of doping of the conjugated polymer chain, as are evident in the as-deposited polythiophene film. The peaks indicated with arrows at 1320, 1200, 1190, and 1020 cm$^{-1}$ match closely with the doping-induced peaks observed in electrochemically prepared polythiophene, independent of the dopant species. The broad peak below 700 cm$^{-1}$ may be ascribed to Cl-specific dopant interactions with the thiophene ring, as observed for plasma-polymerized thiophene doped with Cl. Finally, the sharp peak at 1600 cm$^{-1}$ and the characteristic —OH peak at 3500-3300 cm$^{-1}$ are indicative of atmospheric water interactions with residual iron chloride oxidant in the polythiophene film, which is known to be strongly hydroscopic. Both of these peaks have been observed in FeCl$_3$-doped poly(phenylacetylene) and are also strongly evident in the FeCl$_3$ and FeCl$_2$ spectra themselves. These doping- and oxidant-related peaks are removed for the MeOH-rinsed film, which agrees with the neutral polythiophene reference spectrum, supporting the claim that methanol post-treatment removes the oxidant residue and dedopes the as-deposited oCVD polythiophene film.

Electrochemical Properties

Figure 6:
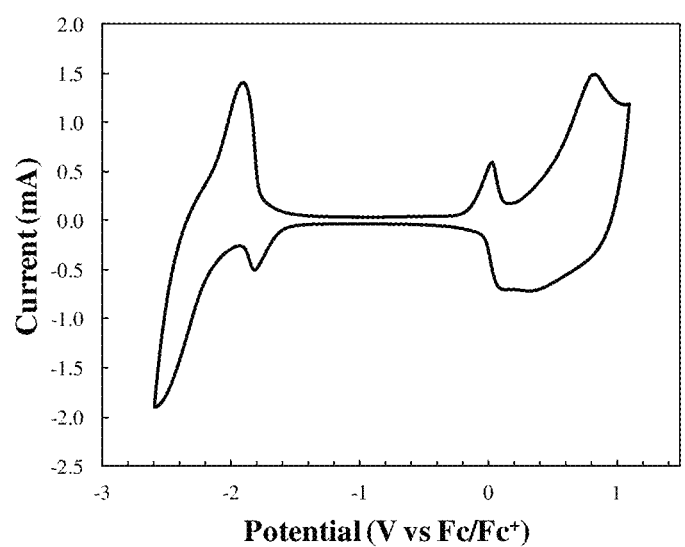
FIG. 6 shows the cyclic voltammogram of the oCVD PT film deposited onto ITO-coated glass in an acetonitrile solution of Bu4NPF6 (0.1 M) at a scan rate of 100 mV s-1. The Ag/Ag+ reference electrode was calibrated using the Fc/Fc+ redox couple.

Cyclic voltammetry was used to study the electrochemical properties of oCVD polythiophene. polythiophene films were deposited onto ITO-coated glass and rinsed in methanol to use as the working electrode. Ferrocene/ferrocenium (Fc/Fc$^+$) was used as an external standard. The half-wave potential ($E_{1/2}$) of the Fc/Fc$^+$ couple was measured under the same testing conditions to be 0.096 V to the Ag/Ag$^+$ electrode. The cyclic voltammogram of the polythiophene film is shown in FIG. 6. The pre-peaks that appear before the peaks for both the n-doping and p-doping processes are due to charge trapping. This phenomenon is often seen during consecutive p- and n-doping cycles of conducting polymers. The onset of the oxidation and reduction peaks were estimated as being 0.36 V and -2.09 V vs Fc/Fc$^+$, respectively. The energy levels of the highest occupied molecular orbital (HOMO) and lowest unoccupied molecular orbital (LUMO) were calculated according to the following equations [48]:

$$E_{HOMO} = -(E_{[onset,ox\ vs\ Fc/Fc^+]} + 5.1)\ (eV) \quad (1)$$

$$E_{LUMO} = -(E_{[onset,red\ vs\ Fc/Fc^+]} + 5.1)\ (eV) \quad (2)$$

These equations assume that the redox potential of Fc/Fc$^+$ has an absolute energy level of -5.1 eV relative to vacuum, although several other values have been used in the literature [48]. The calculated HOMO and LUMO levels are -5.46 eV and -3.01 eV, respectively.

The electrochemical band gap is 2.45 eV.

Photovoltaic Device Performance

Dedoped polythiophene was then prepared on patterned ITO-coated glass substrates for incorporation as the electron donor layer in bilayer heterojunction photovoltaic cells. The PV devices were completed by vacuum thermal evaporation of fullerene C$_{60}$ as the electron acceptor, bathocuproine (BCP) as an exciton blocking layer, and silver (Ag) as the cathode. BCP is commonly used in small molecule organic photovoltaics. The resulting device structures were: ITO/polythiophene/C$_{60}$/BCP (8 nm)/Ag (100 nm).

Figure 7:
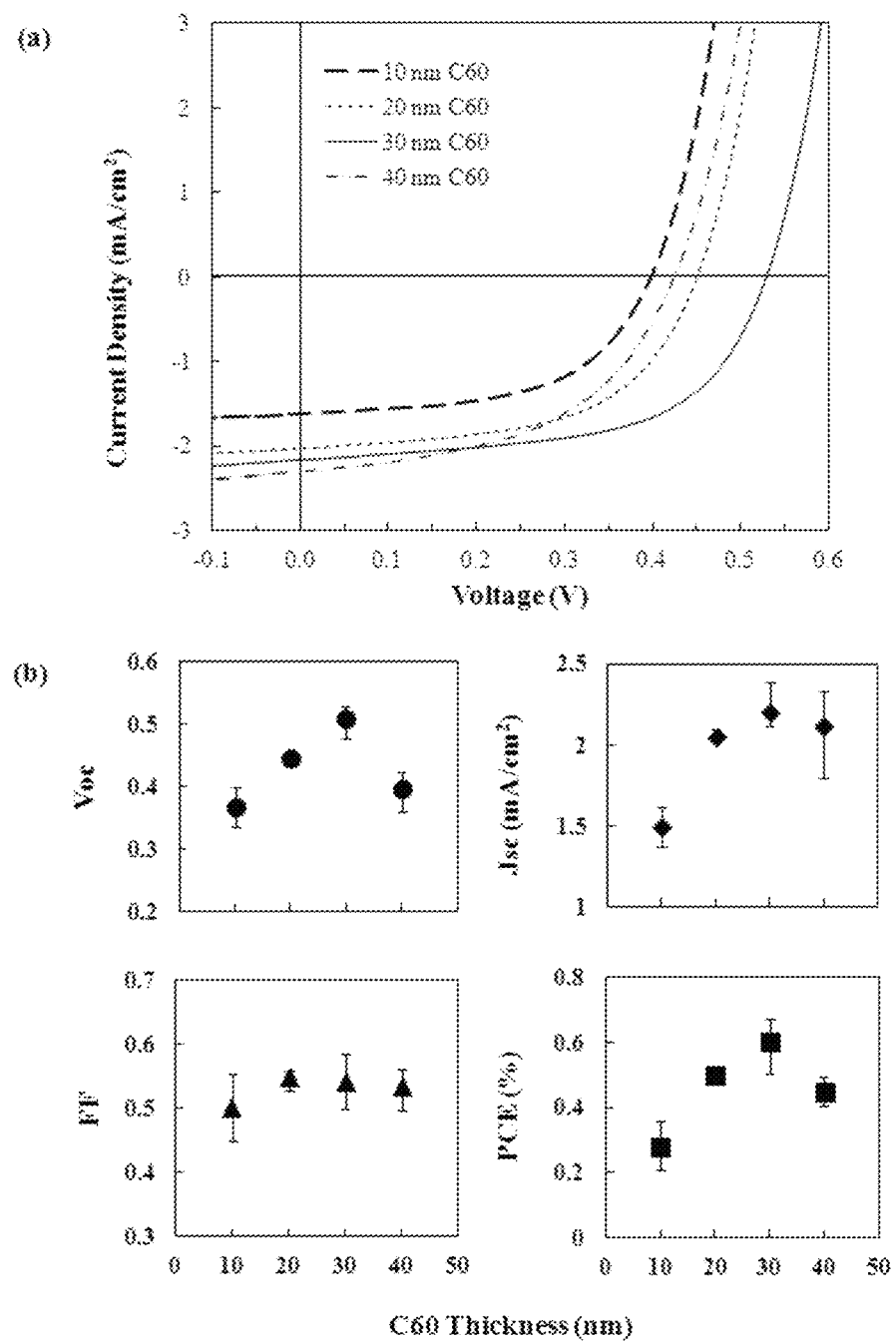
FIG. 7 shows (a) J-V characteristics of devices with structure ITO/PT (~30 nm)/$C_{60}$/BCP (8 nm)/Ag under 100 mW cm-2 AM1.5G simulated solar illumination and (b) performance characteristics of the above devices. Markers and error bars correspond to the average and maximum and minimum values obtained. An efficiency maximum is achieved for a 30 nm-thick $C_{60}$ layer.

First, the thickness of the C$_{60}$ layer was optimized by varying its value and using a polythiophene layer thickness of ~30 nm Representative current-density-voltage (J-V) curves obtained under one sun of air mass 1.5 G (AM 1.5 G) irradiation (100 mW cm$^{-2}$) are shown in FIG. 7(a). The fill factor (FF) remained relatively constant with variation in C$_{60}$ thickness, whereas the open circuit voltage (V$_{oc}$), short-circuit current (J$_{sc}$), and power conversion efficiency (PCE) achieve a maximum at around 30 nm of C$_{60}$ [FIG. 7(b)].

Figure 8:
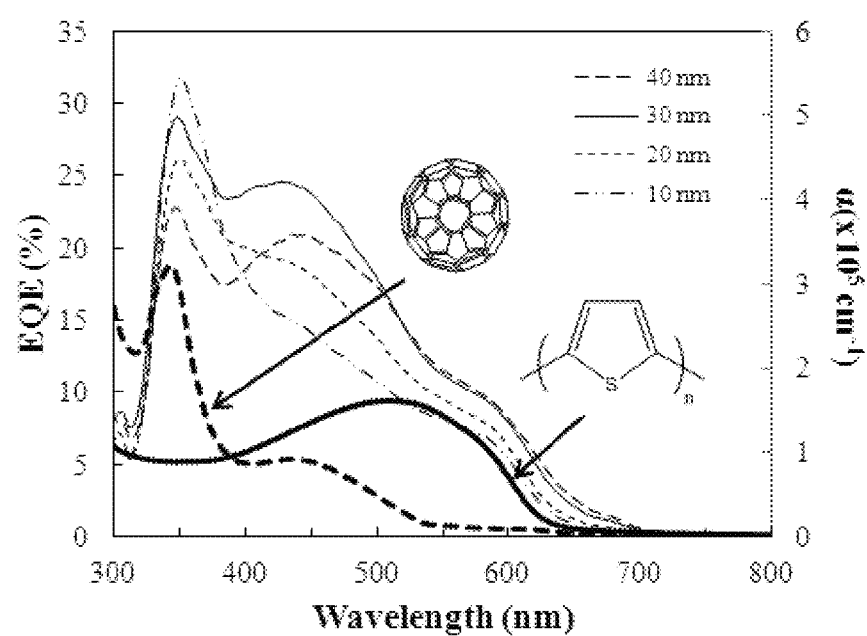
FIG. 8 shows a graph of the EQE spectra for various devices described herein. The thin lines show the EQE spectra (left axis) of the devices in FIG. 6 in which the $C_{60}$ thickness is varied. The bold lines show the absorption coefficients of $C_{60}$ (- -) and oCVD PT (-) (right axis). The absorption edge past 600 nm in the EQE suggests that the oCVD PT is functioning as a photoactive layer.

The change in short-circuit current with increasing C$_{60}$ thickness was expected due to the changes in optical interference patterns within the thin multilayer device stack, as the position of the reflective Ag interface is moved farther from the polythiophene/C$_{60}$ interface. The optical electric field is expected to be maximized for shorter wavelengths (e.g. C$_{60}$ absorption peak) closer to the reflective node and for longer wavelengths (e.g. polythiophene absorption peak) farther from the reflective node, which should vary the relative amount of photocurrent originating from excitons generated in the C$_{60}$ and polythiophene layers, respectively. This effect is evident in FIG. 8, which shows the variation in the external quantum efficiency (EQE) as the thickness of the C$_{60}$ is changed. The bold lines show the absorption coefficients of C$_{60}$ and oCVD polythiophene. Any EQE past about 550 nm should be mainly due to excitons generated in the polythiophene layer and EQE below 400 nm primarily due to C$_{60}$ excitons. As the C$_{60}$ becomes thicker, the shoulder in the EQE curve around 600 nm becomes larger, likely due to additional excitons generated in the polythiophene as the optical field maxima for longer wavelengths are positioned within an exciton diffusion length of the heterojunction interface. In contrast, the EQE at short wavelengths near the C$_{60}$ absorption peaks decrease as the C$_{60}$ thickness is increased. This is likely due to loss of excitons that are generated too far from the heterojunction interface to diffuse and separate before recombining, as the optical field maxima for the shorter wavelengths are positioned deeper into the C$_{60}$ layer. These observations suggest that both polythiophene and C$_{60}$ are contributing to the device photocurrent, which is balanced at around 30 nm of C$_{60}$. Lastly, the J$_{sc}$ values calculated by integrating the product of the EQE and the AM1.5 G solar spectrum are 1.7, 2.0, 2.5, and 2.4 mA/cm$^2$ for 10, 20, 30, and 40 nm of C$_{60}$, respectively. These values are in close agreement with the J$_{sc}$ values shown in FIG. 7.

Figure 9:
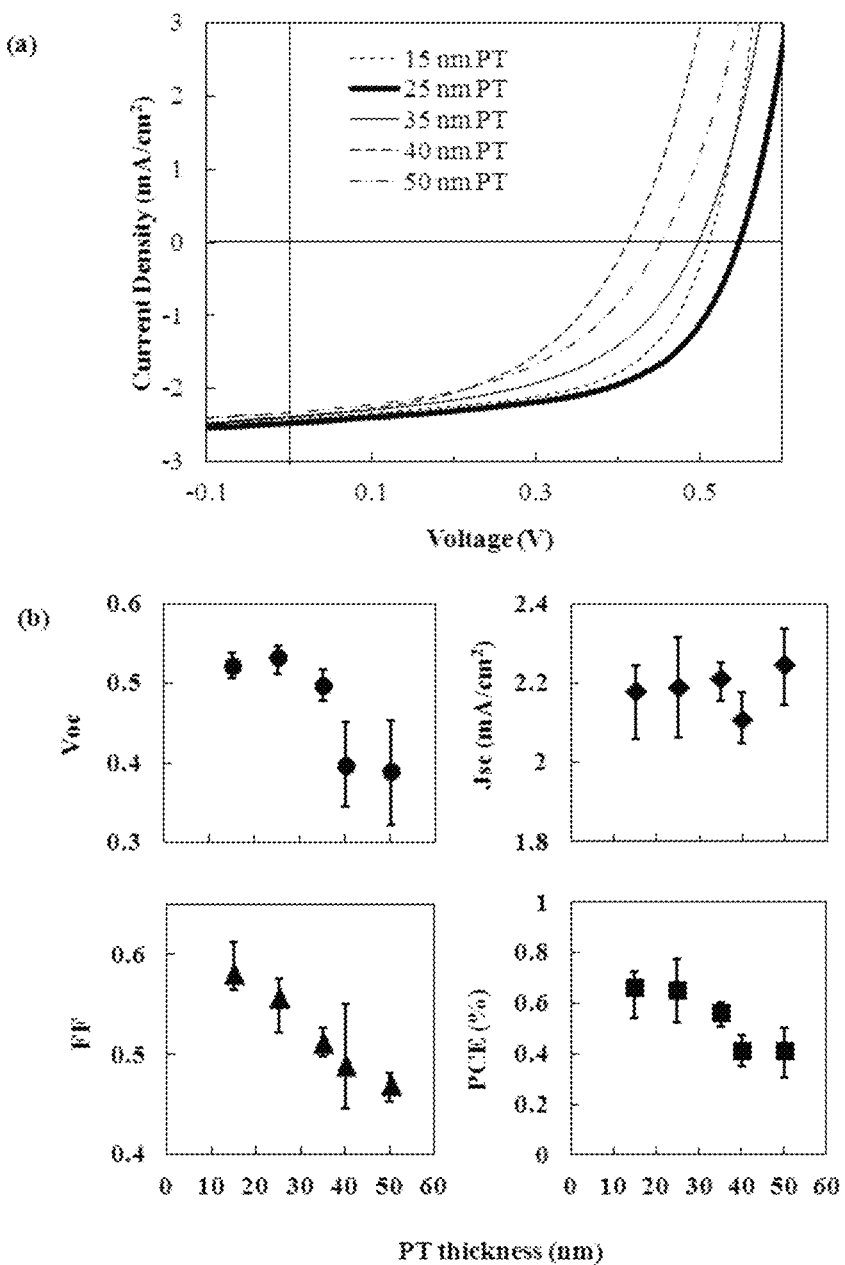
FIG. 9 shows (a) J-V characteristics of devices with structure with structure ITO/PT/$C_{60}$ (30 nm)/BCP (8 nm)/Ag. (b) Performance characteristics of the above devices. Markers and error bars correspond to the average and maximum and minimum values obtained. A maximum efficiency of 0.8% was obtained for a 25 nm PT layer with 30 nm of $C_{60}$.

Devices were then fabricated with a fixed $C_{60}$ thickness of 30 nm and a varying polythiophene thickness. Representative J-V curves for these devices under AM 1.5 G (100 mW cm$^{-2}$) are shown in FIG. 9(a). The $J_{sc}$ for the devices remained constant, but the FF decreased with increasing polythiophene thickness [FIG. 9(b)]. The decrease in fill factor is most likely explained by an increase in series resistance through the device with thicker polythiophene layers, which was generally observed to manifest as a lower slope in the J-V curves at positive bias above $V_{oc}$. Additionally, for devices with a polythiophene layer thicker than about 35 nm, there is much more variability in the values of $V_{oc}$. A maximum PCE of 0.8% was achieved using about 25 nm of polythiophene and 30 nm of $C_{60}$. This is the highest efficiency achieved to date for the use of a vapor-phase deposition of the donor polymer for a polymer solar cell. Furthermore, despite using a bilayer structure, this efficiency is also comparable to bulk heterojunction devices made with polythiophene and similar acceptor materials (Table 2). Higher efficiencies should be possible using bulk heterojunction device structures instead of bilayer structures and with the use of different acceptor materials.

TABLE 2

Summary of device structures and performance that use PT as the donor material. The devices using oCVD PT provide comparable or better performance compared to other PT deposition methods.

| Deposition Method | Device Structure | Acceptor | PCE (%) | Source |
| --- | --- | --- | --- | --- |
| oCVD | Bilayer | $C_{60}$ | 0.8 | This work |
| Solution processing/ thermocleavage | Bulk heterojunction | (60)PCBM | 0.6, 0.84 | [a], [b] |
| Solution processing/ thermocleavage | Bulk heterojunction | (70)PCBM | 1.5 | [a] |
| Electropolymerization | Bilayer | (60)PCBM | 0.1 | [c] |
| Electropolymerization | Single layer (Schottky device) | — | 0.02 | [d] |

[a] S. A. Gevorgyan, F. C. Krebs, Bulk heterojunctions based on native polythiophene, Chem. Mater., 20 (2008) 4386-4390.
[b] T. Tromholt, S. A. Gevorgyan, M. Jorgensen, F. C. Krebs, K. O. Sylvester-Hvid, Thermocleavable materials for polymer solar cells with high open circuit voltage-a comparative study, ACS Appl. Mater. Interfaces, 1 (2009) 2768-2777.
[c] W. L. Yu, B. Xu, Q. F. Dong, Y. H. Zhou, J. H. Zhang, W. J. Tian, B. Yang, A two-step method combining electrodepositing and spin-coating for solar cell processing, J. Solid State Electrochem., 14 (2010) 1051-1056.
[d] R. Valaski, C. D. Canestraro, L. Micaroni, R. M. Q. Mello, L. S. Roman, Organic photovoltaic devices based on polythiophene films electrodeposited on FTO substrates, Sol. Energy Mater. Sol. Cells, 91 (2007) 684-688.

In conclusion, oCVD was used to obtain unsubstituted polythiophene. A doped, conductive form of the polymer was deposited during the oCVD process. Rinsing the film with methanol was sufficient to dedope the polythiophene to obtain the semiconducting form, as confirmed by UV-vis, FTIR, and XPS. By directly depositing onto ITO substrates, the neutral polythiophene was successfully incorporated into efficient bilayer heterojunction photovoltaic devices with $C_{60}$. The external quantum efficiency spectra demonstrate that the oCVD polythiophene contributes to the photocurrent generation of the devices, which is successfully balanced with photocurrent from $C_{60}$ through variation in the layer thicknesses.

It is expected that device fabrication using oCVD active layers will be directly compatible with other substrates, including those that are rough, lack the ability to withstand high temperature, and/or degrade upon exposure to solvents. This technique can easily be extended to the deposition of other semiconducting polymers by changing the monomer used. By utilizing oCVD, the selection of the monomer is no longer constrained by the requirement that the resulting conjugated polymer must be soluble or stable at high temperatures for thermal evaporation. Thus, this opens up a range of materials with potentially desirable properties that can be considered for an active layer material with the goals of improving device efficiency and stability. Additionally, with the use of different monomers to deposit polymers with different bandgaps, oCVD can provide another route for the fabrication of tandem polymer solar cells capable of energy conversion across the solar spectrum. Thus, oCVD is a viable technique that can combine the benefits of vacuum processing and the use of semiconducting polymers for fabricating organic photovoltaics.

Example 3

Figure 15:
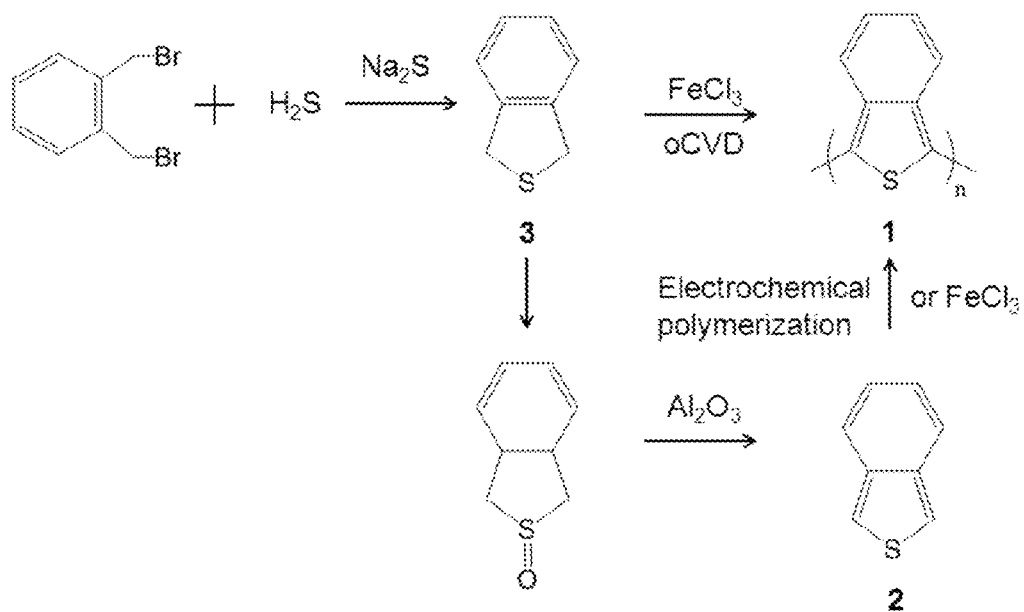
FIG. 15 shows the reaction scheme for obtaining polyisothianaphthene (PITN) (1).

The following examples describe the preparation and characterization, and of polyisothianaphthene by oCVD. Polyisothianaphthene (PITN) (1), shown in FIG. 15, is a material that is known to have a very low bandgap of about 1 eV (Kobayashi, et al., J. Chem. Phys. 82, 1985). Low bandgap polymers have received considerable attention for their various applications in organic electronics, such as organic photovoltaics, photodetectors, organic light emitting diodes, and electrochromic devices. Use of PITN as part of the photoactive layer in an OPV may significantly increase the portion of the solar spectrum that could be absorbed by the photovoltaic devices. However, like unsubstituted polythiophene, PITN is typically insoluble and thus can be relatively difficult to process using conventional techniques. For example, some polymerization methods produce ITN homo- and copolymers that often have low molecular weights and poor film-forming properties. Furthermore, the isothianaphthene monomer precursor (2) is unstable and must be polymerized under special conditions to obtain PITN. In contrast, the molecule 1,3-dihydroisothianaphthene (DHITN) (3), is stable and has been shown to react with FeCl3 to produce PITN (Jen, K, Elsenbaumer, R., Synthetic Metals, 16, 1986). Thus, DHITN was selected as the monomer precursor for depositing PITN by oCVD.

Figure 16:
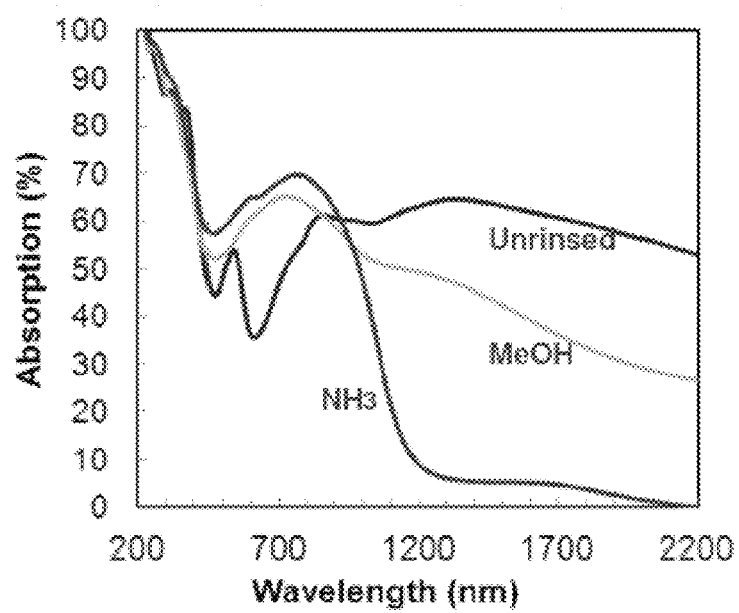
FIG. 16 shows the UV-vis absorption spectra of oCVD PITN films as-deposited, rinsed in methanol, and rinsed in a solution of ammonia in methanol.

The synthesis of DHITN (>96%) (3) was carried out by SynChem, Inc. according to the reaction shown in FIG. 15. Using DHITN 3 as the monomer precursor, films were successfully deposited by oCVD. The UV-vis absorption spectra of the as-deposited and rinsed films are shown in FIG. 16.

Figure 17:
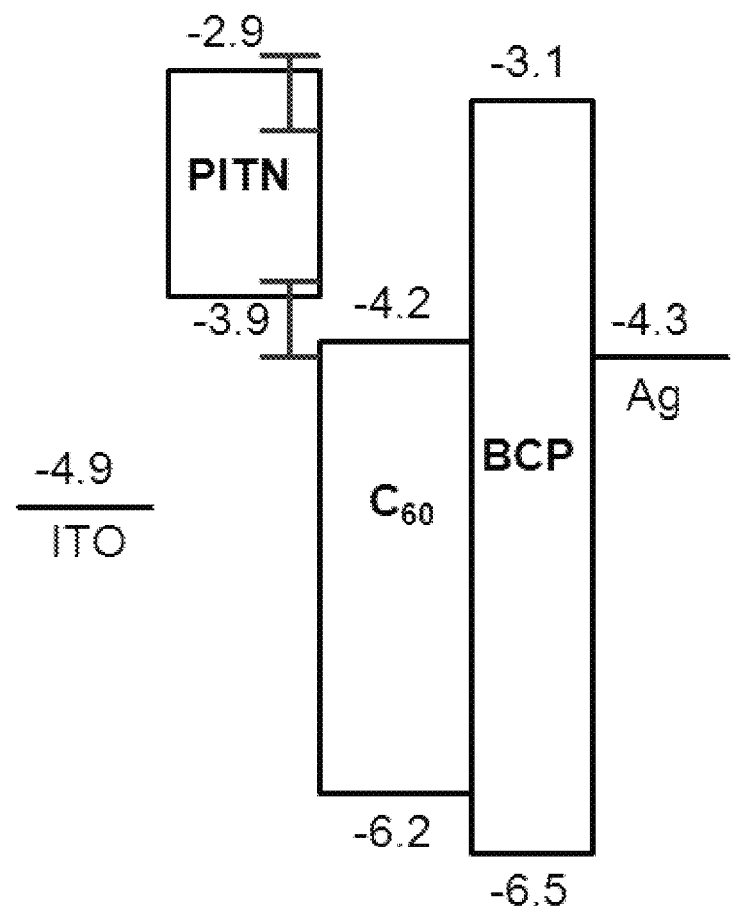
FIG. 17 shows the band diagram showing the energy levels of PITN obtained from cyclic voltammetry, with the energy levels of $C_{60}$ and BCP taken from literature.

In one set of experiments, a rinse in methanol appeared to be insufficient to completely dedope the polymer. However, rinsing with ammonia (dissolved in methanol) resulted in a change in the films absorption spectra that is more indicative of a semiconducting polymer. The optical band gap of PITN, taken as the intersection of the line tangent to the band edge with the x-axis, was 1.05 eV. Cyclic voltammetry measurements were performed on the oCVD PITN films. The onset of oxidation appeared to occur around −0.47V vs Fc/Fc+. The HOMO level was calculated according to an empirical relationship derived from UPS and CV measurements in Andrade, B, et al. Organic Electronics, 2005. The LUMO level was calculated by adding the optical bandgap, 1.05 eV, to the calculated HOMO level. The band energy diagram for a possible OPV device structure is shown in FIG. 17. As can be seen from the energy levels, oCVD PITN and $C_{60}$ may form a Type III heterojunction, making this particular pair of materials unsuitable for certain OPV applications. However, several other materials can be useful as potential acceptors, including: PCBM, ICBA, DBP, ZnPc, and others.

In another set of experiments, after deposition, the PITN films were rinsed to remove reacted oxidant. The rinsing step consisted of sample immersion into methanol (≥99.9%, Sigma-Aldrich) for 10 minutes, followed by dilute HCl for 5 minutes (4.4 mL HCl dissolved in 250 mL methanol), and then ammonia in methanol (2.0M, Sigma-Aldrich) for 5 minutes. The acid rinse step was introduced to fully remove any residual iron left in the films (as studied in Howden, R, et al, *J. Material Chem. A*, 2012), and the ammonia rinse reduced the polymer back to the neutral state.

Figure 18:
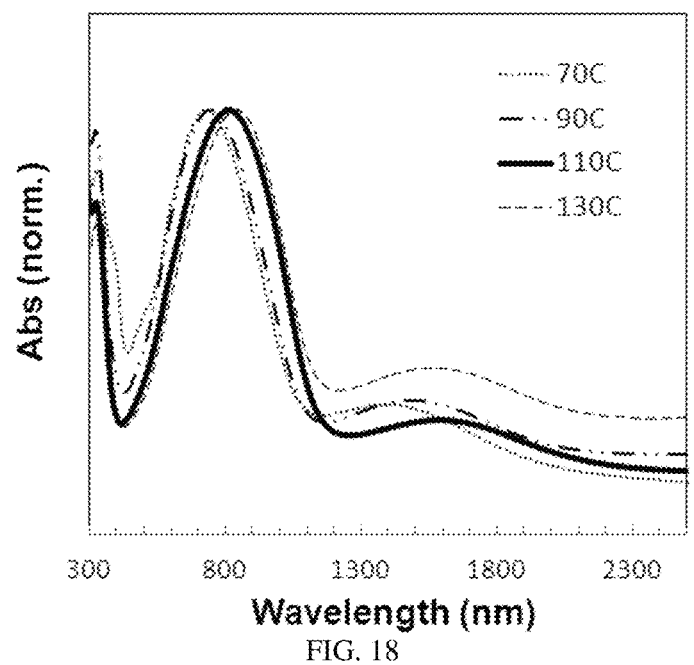
FIG. 18 shows UV-vis absorbance spectra for PITN films deposited at various temperatures.

Finally, a series of depositions were performed in which the stage temperature was held constant at either 70° C., 90° C., 110° C., or 130° C. while the reactor body temperature was held at least 20° C. hotter than the stage. Four-point probe measurements of the as-deposited films showed several order of magnitude increases in the film conductivity with increasing temperature. Conductivities up to about 1 S/cm were achieved. This suggested increased conjugation length with higher temperatures. The UV-vis absorbance spectra for the rinsed films are shown in FIG. 18. As the deposition temperature increased, the maximum in the absorbance spectrum shifted to higher wavelengths. Additionally, the optical band gap, taken as the intersection of the line tangent to the absorption edge with the x-axis, decreased as the temperature increased. These results, summarized in Table 3 below, are consistent with increased conjugation with higher deposition temperatures.

TABLE 3

Optical properties for polymers formed at various deposition temperatures.

| Deposition Temperature (° C.) | $\sigma_{as\text{-}deposited}$ (S/cm) | $\lambda_{max}$ (nm) | $E_g$ (eV) |
|---|---|---|---|
| 70 | — | 726 | 1.05 |
| 90 | 0.001 | 740 | 1.03 |
| 110 | 0.1 | 810 | 1.02 |
| 130 | 1 | 840 | 0.98 |

What is claimed:

1. A method of forming a semiconducting polymer on a surface, comprising:
   reacting a vapor-phase monomer species and a vapor-phase oxidizing agent to produce a vapor comprising a semiconducting polymer precursor;
   contacting the vapor with a surface to form the semiconducting polymer precursor on the surface; and
   treating the semiconducting polymer precursor on the surface with a reducing agent to produce the semiconducting polymer, wherein the conductivity of the semiconducting polymer is less than the semiconducting polymer precursor.

2. A method as in claim 1, wherein the semiconducting polymer is a conjugated polymer.

3. A method as in claim 2, wherein the conjugated polymer is polyacetylene, polyarylene, polyarylene vinylene, or polyarylene ethynylene, any of which are optionally substituted.

4. A method as in claim 2, wherein the conjugated polymer is polyphenylene, polythiophene, polypyrrole, polyaniline, or polyacetylene, any of which are optionally substituted.

5. A method as in claim 2, wherein the conjugated polymer is an optionally substituted polythiophene.

6. A method as in claim 2, wherein the conjugated polymer is an unsubstituted polythiophene.

7. A method as in claim 1, wherein the monomer species is a compound comprising an aryl or heteroaryl group, any of which is optionally substituted.

8. A method as in claim 1, wherein the monomer species is an optionally substituted heteroaryl group.

9. A method as in claim 8, wherein the heteroaryl group is an optionally substituted thiophene.

10. A method as in claim 1, wherein the oxidizing agent is $CuCl_2$, $FeCl_3$, $FeBr_3$, $I_2$, $POBr_3$, $GeCl_4$, $SbI_3$, $Br_2$, $SbF_5$, $SbCl_5$, $TiCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $[CH_3(CH_2)_3]_2O.BF_3$, $(C_2H_5)_3O(BF_4)$, or $BF_3.O(C_2H_5)_2$.

11. A method as in claim 1, wherein the oxidizing agent is $FeCl_3$.

12. A method as in claim 1, wherein the reducing agent is an alcohol, a base, or water.

13. A method as in claim 1, wherein the reducing agent is methanol, ethanol, ammonia, or water.

14. A method as in claim 1, wherein the vapor is contacted with a surface of a flexible substrate.

15. A method as in claim 1, wherein the vapor is contacted with a surface of a glass substrate.

16. A method as in claim 1, wherein the surface comprises an electrode material.

17. A method as in claim 1, wherein the surface comprises indium-tin oxide (ITO).

18. A method as in claim 1, wherein the semiconducting polymer is arranged in a photovoltaic cell.

19. A method as in claim 1, wherein the semiconducting polymer is arranged in a light-emitting diode.

20. A method of claim 1, wherein the conductivity of the semiconducting polymer is less than about $10^{-4}$ S/cm.

21. A method of claim 1, wherein the semiconducting polymer is treated for at least two minutes with the reducing agent.

22. A method of fabricating a photovoltaic device, comprising:
    reacting a vapor-phase monomer species and a vapor-phase oxidizing agent to produce a vapor comprising an electron-donating polymer precursor;
    contacting the vapor with a surface to form the electron-donating polymer precursor on the surface;
    treating the electron-donating polymer precursor on the surface with a reducing agent to produce the electron-donating polymer; and
    providing an electron-accepting material in contact with the electron-donating polymer, wherein the conductivity of the electron-donating polymer is less than the electron-donating polymer precursor.

23. A method as in claim 22, wherein the electron-donating polymer is a conjugated polymer.

24. A method as in claim 23, wherein the conjugated polymer is polyacetylene, polyarylene, polyarylene vinylene, or polyarylene ethynylene, any of which are optionally substituted.

25. A method as in claim 23, wherein the conjugated polymer is polyphenylene, polythiophene, polypyrrole, polyaniline, or polyacetylene, any of which are optionally substituted.

26. A method as in claim 23, wherein the conjugated polymer is an optionally substituted polythiophene.

27. A method as in claim 23, wherein the conjugated polymer is an unsubstituted polythiophene.

28. A method as in claim 22, wherein the monomer species is a compound comprising an aryl or heteroaryl group, any of which is optionally substituted.

29. A method as in claim 22, wherein the monomer species is an optionally substituted heteroaryl group.

30. A method as in claim 29, wherein the heteroaryl group is an optionally substituted thiophene.

31. A method as in claim 22, wherein the oxidizing agent is $CuCl_2$, $FeCl_3$, $FeBr_3$, $I_2$, $POBr_3$, $GeCl_4$, $SbI_3$, $Br_2$, $SbF_5$, $SbCl_5$, $TiCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $[CH_3(CH_2)_3]_2O\cdot BF_3$, $(C_2H_5)_3O(BF_4)$, or $BF_3\cdot O(C_2H_5)_2$.

32. A method as in claim 22, wherein the oxidizing agent is $FeCl_3$.

33. A method as in claim 22, wherein the vapor is contacted with a surface of a flexible substrate.

34. A method as in claim 22, wherein the vapor is contacted with a surface of a glass substrate.

35. A method as in claim 22, wherein the surface comprises an electrode material.

36. A method as in claim 22, wherein the surface comprises indium-tin oxide (no).

37. A method as in claim 22, wherein the electron-accepting material is a fullerene.

38. A method as in claim 22, wherein the surface further comprises a semiconducting material.

39. A method as in claim 22, wherein the electron-donating polymer is arranged in a photovoltaic cell.

40. A method as in claim 22, wherein the electron-donating polymer is arranged in a light-emitting diode.

41. A method of claim 22, wherein the conductivity of the electron-donating polymer is less than about $10^{-4}$ S/cm.

* * * * *